(12) United States Patent
Frattini et al.

(10) Patent No.: US 8,749,995 B2
(45) Date of Patent: Jun. 10, 2014

(54) SINGLE-PULSE RESONANT GATE DRIVER FOR DRIVING SWITCHES IN RESONANT ISOLATED CONVERTERS AND OTHER SYSTEMS

(75) Inventors: Giovanni Frattini, Travaco Siccomario (IT); Roberto G. Massolini, Giussago (IT); Maurizio Granato, Salerno (IT); David I. Anderson, Saratoga, CA (US)

(73) Assignee: Texas Instruments Incorporated, Dallas, TX (US)

( * ) Notice: Subject to any disclaimer, the term of this patent is extended or adjusted under 35 U.S.C. 154(b) by 586 days.

(21) Appl. No.: 13/074,815

(22) Filed: Mar. 29, 2011

(65) Prior Publication Data

US 2012/0249189 A1    Oct. 4, 2012

(51) Int. Cl.
*H02M 3/335*    (2006.01)
(52) U.S. Cl.
USPC ..................................... 363/21.02
(58) Field of Classification Search
CPC ........................... H02M 3/335; H03K 17/6872
USPC ........ 363/16, 20, 21.01, 21.02; 327/109, 387, 327/388, 399
See application file for complete search history.

(56) References Cited

U.S. PATENT DOCUMENTS

| | | | |
|---|---|---|---|
| 5,264,736 A * | 11/1993 | Jacobson | 327/365 |
| 6,208,535 B1 | 3/2001 | Parks | |
| 6,271,645 B1 | 8/2001 | Schneider et al. | |
| 6,441,652 B1 | 8/2002 | Qian | |
| 6,441,673 B1 * | 8/2002 | Zhang | 327/423 |
| 6,477,065 B2 | 11/2002 | Parks | |
| 7,193,392 B2 | 3/2007 | King et al. | |
| 7,245,108 B2 | 7/2007 | Chertok et al. | |
| 7,378,818 B2 | 5/2008 | Fowler et al. | |
| 7,612,602 B2 * | 11/2009 | Yang et al. | 327/494 |
| 8,547,143 B2 * | 10/2013 | Swamy et al. | 327/109 |

FOREIGN PATENT DOCUMENTS

WO    WO 01/01574 A1    1/2001

OTHER PUBLICATIONS

Stephen W. Moore, et al., "A Review of Cell Equalization Methods for Lithium Ion and Lithium Polymer Battery Systems", Mar. 5, 2001, 5 pages.
Thomas Stuart, et al., "A Modular Battery Management System for HEVs", Jun. 3, 2002, 9 pages.

(Continued)

*Primary Examiner* — Matthew Nguyen
(74) *Attorney, Agent, or Firm* — Eugene C. Conser; Wade J. Brady, III; Frederick J. Telecky, Jr.

(57) ABSTRACT

A gate driving circuit includes a driving stage configured to receive an input signal and generate a gate drive signal for a gate of a transistor switch. The gate driving circuit also includes an LC circuit having an inductor and a gate capacitance of the transistor switch. The LC circuit is configured so that a pulse in the gate drive signal generates a ringing in the LC circuit at a resonance frequency of the LC circuit to transfer energy into and out of the gate capacitance of the transistor switch. A switch could selectively couple the gate of the transistor switch to ground in order to discharge the gate capacitance. A control circuit could be used to provide the input signal, and the control circuit could be configured to regulate a duty cycle of the gate drive signal by adjusting an off-time between consecutive pulses in the input signal.

17 Claims, 7 Drawing Sheets

(56) References Cited

OTHER PUBLICATIONS

Chen, Yuhui, "Resonant Gate Drive Techniques for Power MOSFETs", Thesis submitted to the Faculty of the Virginia Polytechnic Institute and State University, May 2000, 86 pages.

Zhang, Zhiliang et al., "Optimal Design of Resonant Gate Driver for Buck Converter Based on a New Analytical Loss Model", IEEE Transactions on Power Electronics, vol. 23, No. 2, Mar. 2008, 14 pages.

de Vries, Ian D., "A Resonant Power MOSFET/IGBT Gate Driver", IEEE, 2002, pp. 179-185.

Pan, S. et al., "A New Resonant Gate Driver with Two Half Bridge Structures for Both Top Switch and Bottom Switch", Proceeding of IEEE Power Electronics and Specialists Conference, Jun. 2007, pp. 2399-2403.

* cited by examiner

SINGLE-PULSE RESONANT GATE DRIVER FOR DRIVING SWITCHES IN RESONANT ISOLATED CONVERTERS AND OTHER SYSTEMS

TECHNICAL FIELD

This disclosure is generally directed to switch gate drivers. More specifically, this disclosure is directed to a single-pulse resonant gate driver for driving switches in resonant isolated converters and other systems.

BACKGROUND

Isolated power converters represent converters that ensure electrical isolation between their input sides and their output sides. This is typically accomplished using transformers. Many isolated power converter architectures exist, such as flyback converters, forward converters, and resonant converters.

Isolated power converters and other systems routinely include gate drivers for providing signals to the gates of transistor switches. While it may be desirable to increase the frequency at which the transistor switches are driven, this typically increases the power consumed in driving the transistor switches.

BRIEF DESCRIPTION OF DRAWINGS

For a more complete understanding of this disclosure and its features, reference is now made to the following description, taken in conjunction with the accompanying drawings, in which.

DETAILED DESCRIPTION

FIGS. 1 through 13, discussed below, and the various embodiments used to describe the principles of the present invention in this patent document are by way of illustration only and should not be construed in any way to limit the scope of the invention. Those skilled in the art will understand that the principles of the invention may be implemented in any type of suitably arranged device or system.

In one aspect, this disclosure generally describes novel architectures for resonant isolated power converters that do not require feedback from the secondary sides of the power converters to the primary sides of the power converters. For this reason, these power converters may be referred to as "feedbackless" power converters. In another aspect, this disclosure generally describes novel architectures for bi-directional resonant isolated power converters. In yet another aspect, this disclosure generally describes a novel architecture for driving a gate of a transistor in a resonant power converter or other device using a single-pulse resonant gate driver.

Feedbackless Resonant Isolated Power Converters

Figure 1:
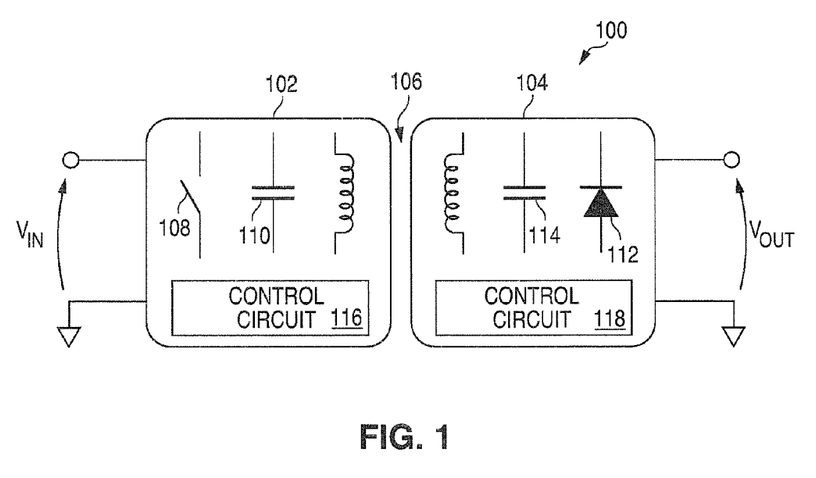
FIGS. 1 through 4 illustrate example resonant isolated converters according to this disclosure.
Figure 2:
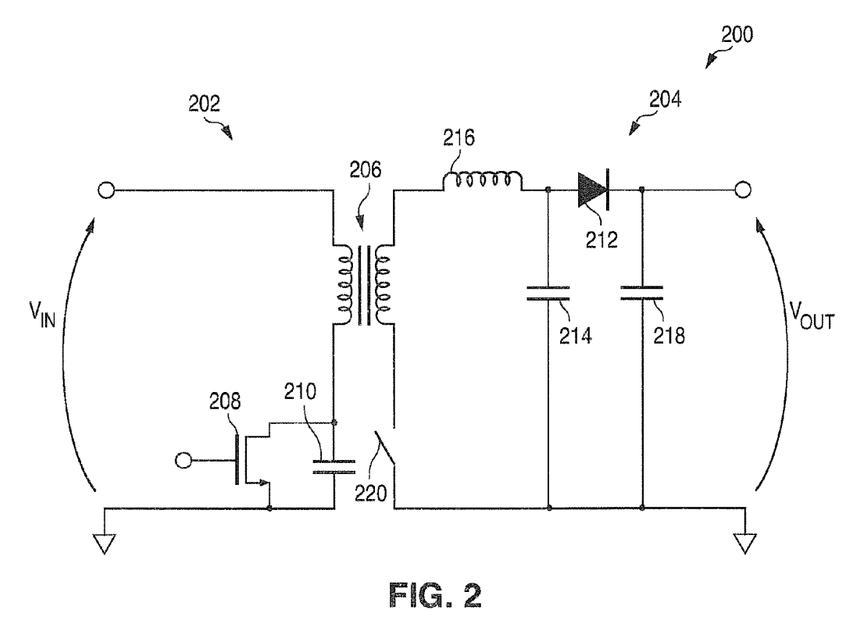
Figure 3:
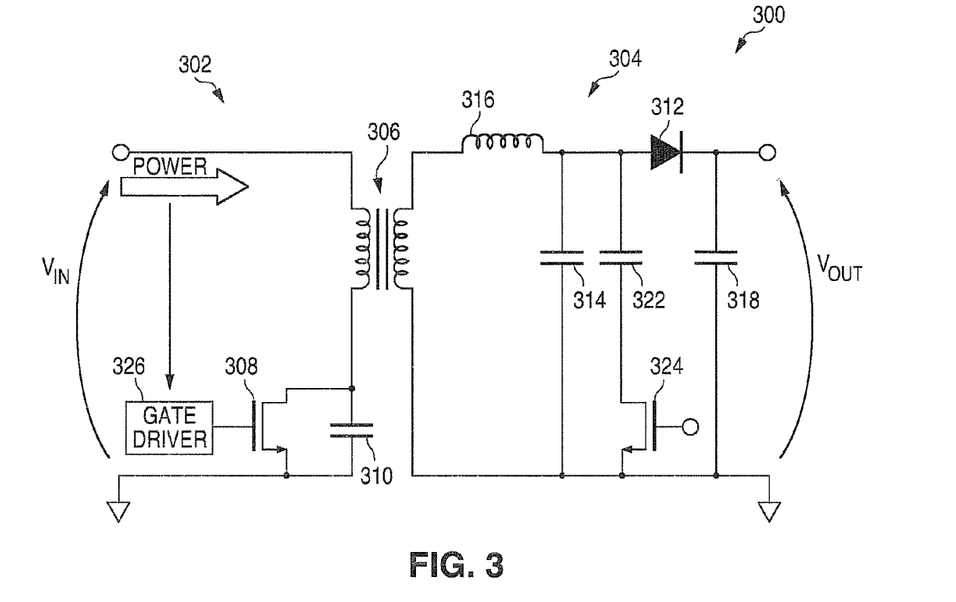
Figure 4:
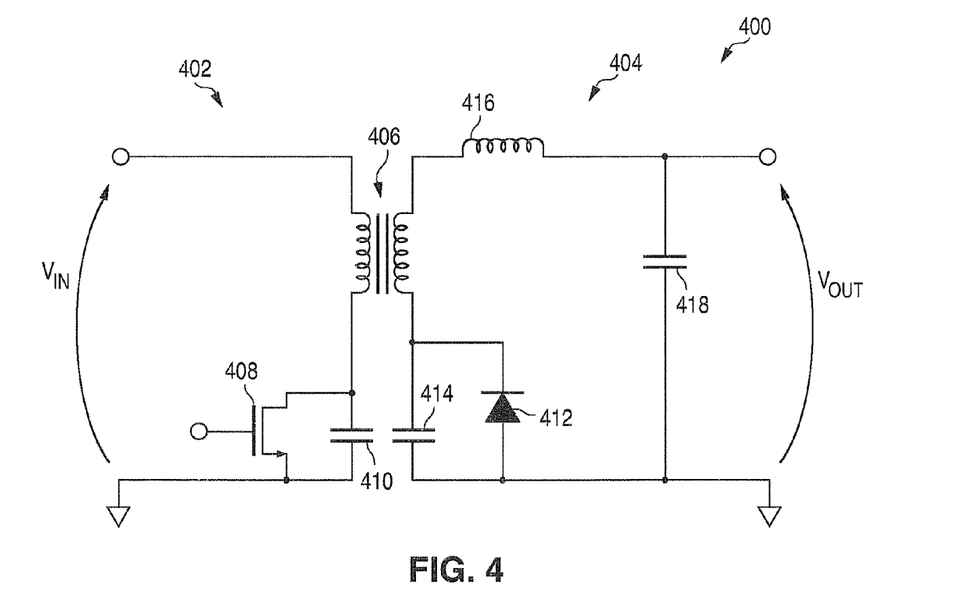

FIGS. 1 through 4 illustrate example resonant isolated converters according to this disclosure. In particular, FIG. 1 illustrates general details of an example resonant isolated converter 100, while FIGS. 2 through 4 illustrate more specific implementations of example resonant isolated converters 200, 300, and 400.

As shown in FIG. 1, a resonant isolated converter 100 receives an input voltage $V_{IN}$ and generates an output voltage $V_{OUT}$. The output voltage $V_{OUT}$ can be regulated by controlling the operation of the converter 100 in order to achieve a desired voltage level for the output voltage $V_{OUT}$. The converter 100 represents an isolated converter in that the converter 100 includes a primary side 102 and a secondary side 104, which are electrically isolated by a transformer 106.

In this example, the primary side 102 includes at least one switch 108 and at least one capacitor 110, and the secondary side 104 includes at least one rectifying diode 112 and at least one resonant capacitor 114. Each switch 108 includes any suitable structure for selectively coupling electrical components, such as a transistor. Each diode 112 includes any suitable structure for substantially limiting current flow to one direction. Each of the capacitors 110 and 114 includes any suitable capacitive structure having any suitable capacitance. The transformer 106 includes any suitable transformer structure, such as a coreless or "air gap" transformer.

In FIG. 1, the primary side 102 is arranged to operate as a resonator (such as a Class E or other resonator), and the secondary side 104 is arranged to operate as a resonant rectifier. In the primary side 102, a controlled oscillation is maintained by switching on and off the switch 108 using a control circuit 116. In the secondary side 104, the resonant rectifier can be turned on and off in a suitable manner by a control circuit 118. Each control circuit 116-118 includes any suitable structure for controlling one or more operations of its associated circuitry. In this document, a resonant rectifier is said to be turned off by stopping substantially all power transfer to a load, regardless of how the power transfer is stopped (opening the circuit in the resonant rectifier, detuning the resonant rectifier, etc.).

In one aspect of operation, the control circuit 118 for the secondary side 104 can measure a quantity that needs to be controlled, such as the output voltage $V_{OUT}$. The control circuit 118 can regulate that quantity by turning on and off the resonant rectifier in the secondary side 104. Any suitable mechanism can be used to switch off the secondary side's resonant rectifier. Also, this can be accomplished without sending any signal to the primary side 102 across an isolation barrier. This is possible because the primary side 102 is operating as a resonator and can sustain its stationary oscillation, but little or no power is transferred to the secondary side 104 when the resonant rectifier in the secondary side 104 is turned off. As a result, the primary side's resonator absorbs from the input voltage $V_{IN}$ only the power associated with the primary side's losses during these times. Since the primary side's resonator can be tuned to transmit a constant amount of power to the secondary side 104, it is possible for the primary side's control circuit 116 to discriminate when the primary side 102 is actively resonating without a load. The control circuit 116 can therefore detect a drop in input power and switch off the primary side's resonator to eliminate those losses. However, the control circuit 116 could alternatively keep the primary side's resonator turned on to keep the primary side more responsive (even if a small amount of power may be lost).

Based on the principle that the primary and secondary sides 102-104 can be independently turned on and off, various control mechanism can be used with the resonant isolated converter 100. For example, assume the voltage on an output capacitor of the converter 100 needs to be regulated in the presence of a load. When both the primary and secondary sides 102-104 are on, the output voltage $V_{OUT}$ increases. The secondary side's control circuit 118 can compare the output voltage $V_{OUT}$ with a threshold voltage (such as a fixed reference voltage) and switch off the secondary side's resonant rectifier when the output voltage $V_{OUT}$ reaches the threshold. The output voltage $V_{OUT}$ then starts to decrease due to the presence of the load. The primary side's control circuit 116 detects that the input power has dropped since, when the secondary side's resonant rectifier is turned off, little or no power is being transferred from the primary side 102 to the secondary side 104. The control circuit 116 could then optionally switch the primary side's resonator off to reduce losses. Both the primary and secondary control circuits 116-118 could then switch back on independently, such as after a fixed amount of time (for constant off-time control). At that point, the output voltage $V_{OUT}$ starts to increase again, and the process is repeated.

FIG. 2 illustrates an example resonant isolated converter 200, which represents a more detailed implementation of the converter 100 shown in FIG. 1. In this example, the resonant isolated converter 200 includes a primary side 202 and a secondary side 204, which are electrically isolated by a transformer 206. The primary side 202 includes a switch 208 (such as an NMOS or other transistor) coupled in parallel with a capacitor 210. The secondary side 204 includes a rectifying diode 212 coupled to a resonant capacitor 214 and a resonant inductor 216. The secondary side 204 also includes an output capacitor 218. A resonant rectifier is formed in the secondary side 204 by the diode 212, the capacitor 214, and the inductor 216. The inductor 216 includes any suitable inductive structure having any suitable inductance.

As noted above with respect to FIG. 1, any suitable mechanism can be used to switch off the secondary side's resonant rectifier. In the embodiment shown in FIG. 2, a switch 220 is placed in series with the resonant rectifier of the secondary side 204. The switch 220 (such as a transistor or other switching device) can be opened to turn off the resonant rectifier and closed to turn on the resonant rectifier.

FIG. 3 illustrates an example resonant isolated converter 300 using a different approach for controlling the secondary side's resonant rectifier. The converter 300 is similar in structure to the converter 200, and components 302-318 in the converter 300 may be the same as or similar to the corresponding components 202-218 in the converter 200. The secondary side's resonant rectifier is formed by the diode 312, the capacitor 314, and the inductor 316.

In this embodiment, since both the primary and secondary sides 302-304 are resonant, they may be tuned very well with one another so that power can be transferred properly and efficiently from one side 302 to the other side 304. As a result, the secondary side's resonant rectifier can be turned off by detuning the secondary side 304 in order to alter the resonant parameters of the secondary side 304. In this example, the detuning is accomplished using a capacitor 322 coupled in series with a switch 324, where both components 322-324 are coupled in parallel with the capacitor 314. When the switch 324 is closed, the capacitor 322 is coupled in parallel with the resonant capacitor 314, which alters the overall capacitance within the resonant rectifier. This changes the resonance frequency in the secondary side 304 so that it cannot properly couple to the primary side 302 in order to allow power to transfer across the isolation transformer 306.

In FIG. 3, the primary side's resonator can be made inactive by switching off the drive signal on the gate of the switch 308. The drive signal is provided by a gate driver 326, which represents any suitable structure for driving a signal. In this example, the gate driver 326 could be capable of monitoring the amount of input power flowing into the primary side 302 and can control the switch 308 based on that information. As described above, when the secondary side's resonant rectifier is turned off, the amount of input power required by the primary side 302 decreases. The gate driver 326 could detect this condition and turn off the switch 308 in response, thereby deactivating the primary side's resonator to reduce power losses (although the primary side's resonator could also be kept on).

As shown in FIG. 4, a resonant isolated converter 400 includes a primary side 402 and a secondary side 404, which are isolated by a transformer 406. The primary side 402 includes a switch 408 coupled in parallel with a capacitor 410. The secondary side 404 includes a rectifying diode 412 coupled in parallel with a resonant capacitor 414. The secondary side 404 also includes a resonant inductor 416 and an output capacitor 418. In this example, thanks to the isolated nature of the architecture, the resonant rectifier in the secondary side 404 can be rearranged so that the rectifying diode 412 has its anode connected to ground and the resonant capacitor 414 is connected between the diode's cathode and ground.

In some embodiments, the diode 412 can be implemented using the parasitic body-drain diode of an NMOS transistor. This makes the design compatible with on-chip integration. In these embodiments, both the switch 408 and the diode 412 can be implemented using NMOS transistors, and each transistor could be reconfigurable to function as either a switch or a diode. This design could therefore support bi-directional transfer of power since the component 408 could be reconfigured as a diode and the component 412 could be reconfigured as a switch, although additional components may be needed to support true bi-directional power transfer.

In this way, the resonant isolated converters 100-400 may provide feedbackless power conversion. While isolation is still used to separate the primary and secondary sides of the converters, no feedback signal is needed between the primary and secondary sides. This eliminates the need for communication transformers, opto-couplers, or other isolation mechanisms for the feedback signal. This can therefore reduce the size and cost of the resonant isolated converters 100-400 compared to conventional converters.

Although FIGS. 1 through 4 illustrate examples of resonant isolated converters, various changes may be made to FIGS. 1 through 4. For example, other mechanisms could be used to deactivate the primary side's resonator and/or the secondary side's resonant rectifier. Also, each of the components in FIGS. 1 through 4 could be implemented using any suitable structure(s), and various components in FIGS. 1 through 4 could be combined, further subdivided, omitted, or rearranged and additional components could be added according to particular needs. In addition, components shown in one figure could be used in other figures, such as when the converters 200, 300, and 400 include the control circuits 116-118 of FIG. 1 or when the converters 100, 200, and 400 include one or more instances of the gate driver 326.

Feedbackless Bi-Directional Resonant Isolated Power Converters

Figure 5:
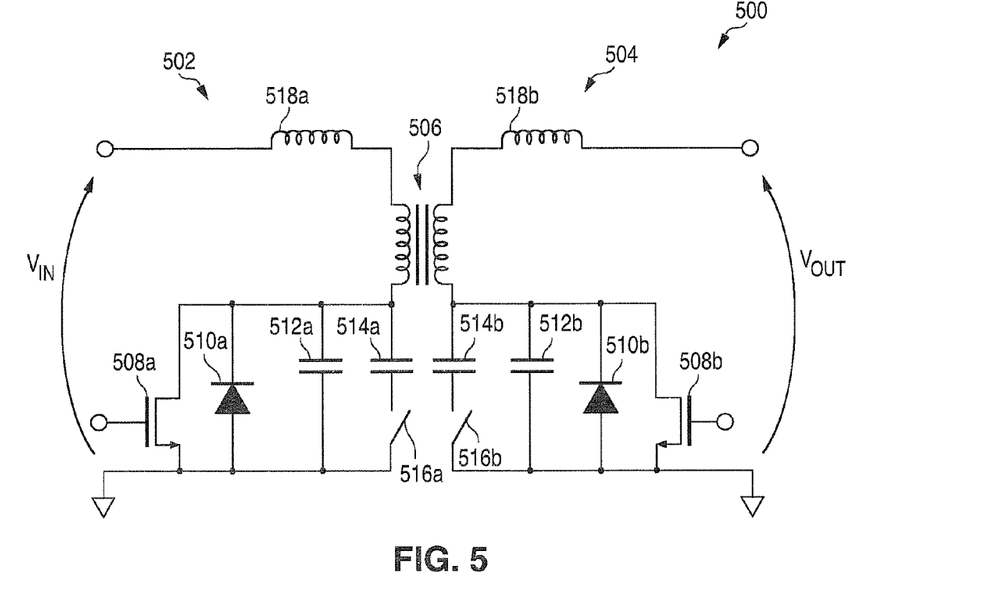
FIG. 5 illustrates an example bi-directional resonant isolated converter according to this disclosure.

FIG. 5 illustrates an example bi-directional resonant isolated converter 500 according to this disclosure. As shown in FIG. 5, the converter 500 includes a first side 502 and a second side 504 isolated by a transformer 506. The first side 502 includes a switch 508a, a diode 510a, and a capacitor 512a coupled in parallel. A capacitor 514a and a switch 516a are coupled in parallel with these components. Similarly, the second side 504 includes a switch 508b, a diode 510b, and a capacitor 512b coupled in parallel. A capacitor 514b and a switch 516b are coupled in parallel with these components. An inductor 518a is coupled to one side of the transformer 506, and an inductor 518b is coupled to another side of the transformer 506. Note that the sides 502 and 504 are referred to as "first" and "second" since, being bi-directional, either side could operate as a primary side or a secondary side.

Depending on the implementation (such as when the converter 500 uses a primary side Class E resonator), the addition of an inductor in series with the transformer's primary side is acceptable. That inductor 518a or 518b (depending on the direction of power transfer) can be seen as a fraction of the transformer's inductance that is not coupled to the transformer's secondary side. In reality, such an additional inductance is typically always present and is commonly referred to as the transformer's leakage inductance since real transformers typically cannot reach a perfect coupling factor of one between their primary and secondary sides.

In FIG. 5, power can be transferred in either direction by configuring the switches 508a-508b and 516a-516b appropriately. Each side of the converter 500 can be tuned to act as a primary resonator or a secondary resonant rectifier, which can be obtained by tuning the capacitances with the additional capacitors 514a-514b. These additional capacitors 514a-514b can be connected or disconnected through the series switches 516a-516b. For example, when power is to be transferred from the first side 502 to the second side 504, the capacitors 512a-512b can be properly tuned using the capacitors 514a-514b and the switches 516a-516b, the switch 508a can be properly driven at the desired switching frequency, and the switch 508b can be opened during this time.

Although FIG. 5 illustrates one example of a bi-directional resonant isolated converter 500, various changes may be made to FIG. 5. For example, other mechanisms could be used to deactivate the primary side's resonator and the secondary side's resonant rectifier, or the primary side's resonator may remain active. Also, each of the components in FIG. 5 could be implemented using any suitable structure(s), and various components in FIG. 5 could be combined, further subdivided, omitted, or rearranged and additional components could be added according to particular needs. In addition, components shown in one figure above could be used in other figures, such as when the converter 500 includes the control circuits 116-118 of FIG. 1 or one or more instances of the gate driver 326.

Single-Pulse Resonant Gate Driver

When it comes to switching power converters, increasing the switching frequency in a power converter generally is an effective way to reduce the size and cost of the converter because its magnetic components become smaller. However, this is challenging for the converter's performance since switching losses associated with switching transitions every clock cycle increase, making it harder to obtain good overall converter efficiency.

One of the contributions to switching losses is switch gate driving loss. Every time a switch is turned on and off, its gate capacitance is charged and discharged. The power consumption for a driving circuit that drives a switch can be expressed as $W_D = C_G V_{GS}^2 F_{SW}$, where $W_D$ denotes the power consumption, $C_G$ denotes the gate capacitance, $V_{GS}$ denotes the switch's gate-to-source voltage, and $F_{SW}$ denotes the switching frequency. One way to decrease this loss contribution is to build a resonant gate driver in which energy used to charge the gate capacitance is recovered into a storage element (such as an inductor) instead of being lost every cycle. Unfortunately, one problem with these circuits is that they generate a sinusoidal wave at fixed frequency on the gate voltage. As a result, it is difficult to modulate the switching duty cycle, which is commonly needed for the power converter to achieve a desired regulation function.

Figure 6:
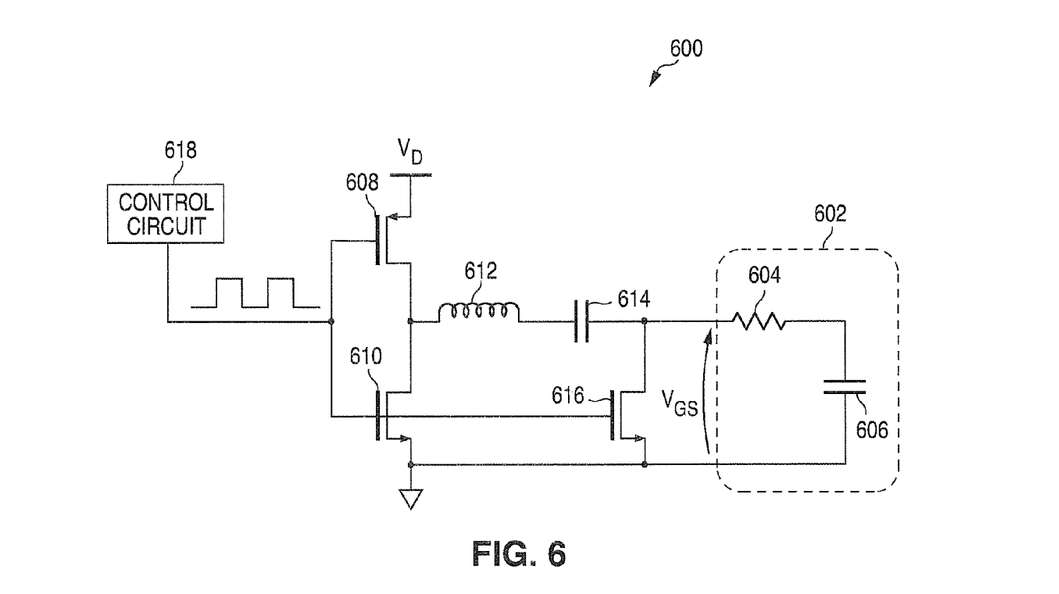
FIGS. 6 and 7 illustrate an example single-pulse resonant gate driver and related details according to this disclosure.
Figure 7:
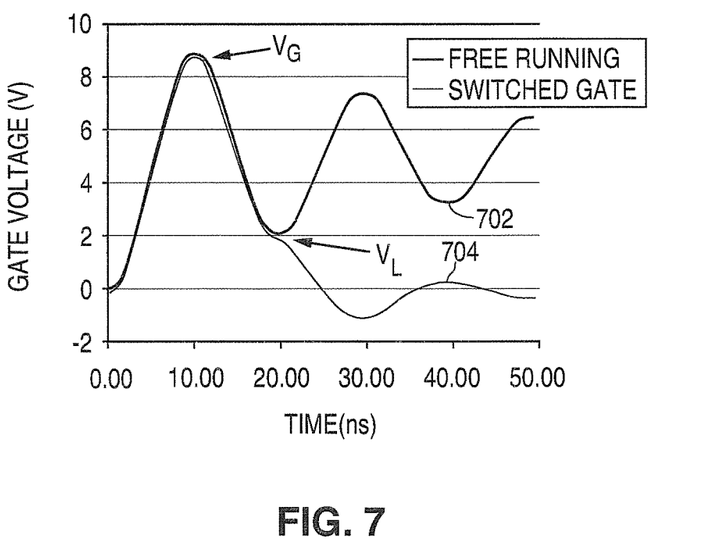

FIGS. 6 and 7 illustrate an example single-pulse resonant gate driver 600 and related details according to this disclosure. The resonant gate driver 600 includes a resonance mechanism to recover energy used to charge and discharge a switch's gate capacitance, while allowing control of the duty cycle of the switch's operation.

As shown in FIG. 6, the resonant gate driver 600 includes or is coupled to a switch 602, which is modeled in this example by a resistor 604 (for its gate resistance) and a capacitor 606 (for its gate capacitance). The switch 602 could represent any of the switches in the resonant isolated converters 100-500 described above, such as the switches 108, 208, 308, 408, 508a-508b. Note, however, that the resonant gate driver 600 could be used in any suitable power converter or other device and is not limited to use in resonant isolated power converters.

In this example, the resonant gate driver 600 includes two switches 608-610 coupled in series, where gates of the switches 608-610 receive the same input signal. The switch 608 could represent a PMOS transistor, and the switch 610 could represent an NMOS transistor. The switches 608-610 form a driving stage for driving the gate of the switch 602. An inductor 612 is coupled between the switches 608-610, and the inductor 612 may be coupled in series with a capacitor 614 (although the capacitor 614 is optional). A switch 616 can selectively couple the gate of the switch 602 to ground. The switch 616 could represent an NMOS transistor. An LC circuit is formed here by the inductor 612, the capacitor 606, and optionally the capacitor 614.

An example of how the resonant gate driver 600 may operate is shown in FIG. 7, where line 702 represents the free-running LC step response and line 704 represents example operation of the resonant gate driver 600. When the output of the driving stage (switches 608-610) goes high, the LC circuit responds to that step voltage with a ringing at its natural resonance frequency, which can be expressed as $f_g = 1/2\pi\sqrt{LC}$. The natural resonance frequency $f_g$ has a damping factor that depends on the associated resistive losses, and gate voltage overshoots can go back close to the initial value. During this process, energy flows from the driver's supply voltage $V_D$ to the gate of the switch 602 and then back to the driver's supply voltage.

If the driving stage switches back to zero when the gate voltage is at a low peak $V_L$, the residual energy that is still on the gate capacitance and that gets dissipated can be expressed as $E_D' = C_G V_L^2$. This can be significantly lower than $E_D = C_G V_G^2$, which would be the dissipated energy in case of a conventional driver that switches the gate capacitance between 0V and $V_G$.

The switch 616 can be used to further improve the performance of the resonant gate driver 600. The switch 616 is coupled between the gate node and ground to allow fast discharging of $E_D'$. This reduces the additional inductive ringing associated with the LC circuit.

After a single pulse on the gate of the switch 602 has been generated, there may be no constraints about when the next pulse should occur. As a result, a control circuit 618 can regulate the actual gate duty cycle by properly adjusting the off-time between consecutive pulses. The control circuit 618 includes any suitable structure for controlling the driving of a signal to a switch gate or other destination.

The capacitor 614 can optionally be used here to adjust the level of the peak voltage $V_G$ on the gate node to a desired fraction of $V_G$. This allows tradeoffs to occur in the sizing of the inductor 612.

Although FIGS. 6 and 7 illustrate one example of a single-pulse resonant gate driver 600 and related details, various changes may be made to FIGS. 6 and 7. For example, each of the components in FIG. 6 could be implemented using any suitable structure(s), and various components in FIG. 6 could be combined, further subdivided, omitted, or rearranged and additional components could be added according to particular needs. Also, the waveforms shown in FIG. 7 are for illustration only. In addition, as noted above, the resonant gate driver 600 could be used in any of the resonant isolated converters described above, such as in the gate driver 326. However, the resonant gate driver 600 could be used in any other suitable devices or systems, such as non-isolated power converters or non-power converter devices.

Example Systems

FIGS. 8 through 11 illustrate example systems incorporating a resonant isolated converter and/or a single-pulse resonant gate driver according to this disclosure. These systems are provided merely as examples of the systems in which a resonant isolated converter and/or a single-pulse resonant gate driver could be used. The resonant isolated converters and the single-pulse resonant gate driver described above could be used in any other suitable device or system. For instance, the resonant isolated converters and the single-pulse resonant gate driver could be used in various very high-frequency systems, such as those that operate switches or other devices in the 5 MHz-300 MHz range (although they could be used in other systems, as well).

Figure 8:
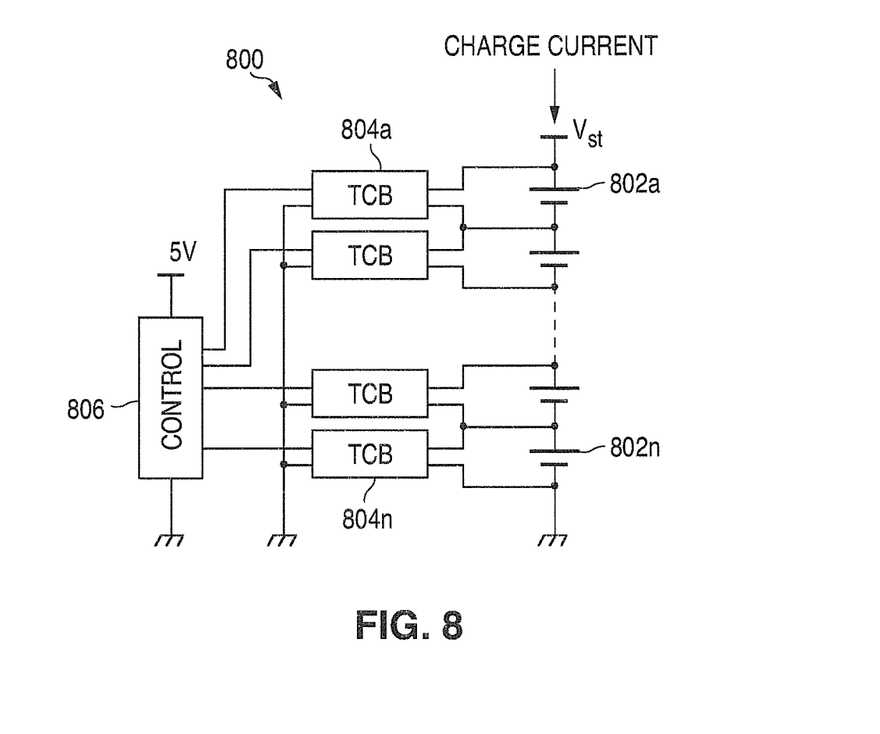
FIGS. 8 through 11 illustrate example systems incorporating a resonant isolated converter and/or a single-pulse resonant gate driver according to this disclosure.

FIG. 8 illustrates an example power supply charge balancing system 800. In this example, the system 800 includes or is coupled to multiple power supplies 802a-802n coupled in series. Each of the power supplies 802a-802n includes any suitable structure for providing power, such as a battery cell within a single battery or a battery within a string of batteries. Each of the power supplies 802a-802n could be designed to provide any suitable voltage, and the stack of power supplies 802a-802n could be designed to collectively provide a high output voltage $V_{ST}$.

Mismatches between the power supplies 802a-802n negatively affects the charging and discharging of the power supplies 802a-802n. For example, if one of the power supplies 802a-802n has a much lower output voltage than the others, it is difficult to charge the entire string of power supplies 802a-802n by simply providing a charge current to the string. These mismatches can be due to any number of factors, such as production variations, temperature differences, or aging.

The system 800 therefore supports a technique for charging the power supplies 802a-802n individually or in groups. In this example, the system 800 includes multiple high frequency (HF) transformer charge balancers 804a-804n. The charge balancers 804a-804n represent resonant boost switchers that can provide energy to the power supplies 802a-802n in order to help balance the charges on the power supplies 802a-802n. Each of the charge balancers 804a-804n can provide energy to an individual one of the power supplies 802a-802n, and multiple charge balancers 804a-804n can operate concurrently to provide energy to groups of power supplies 802a-802n. Also, the time in which each power supply or group of power supplies is charged may vary, and different charging times can be supported concurrently. The charge balancers 804a-804n are said to be high frequency since the charge balancers 804a-804n include switches that are turned on and off at high frequencies, such as 5 MHz-20 MHz.

The charge balancers 804a-804n are controlled by a control unit 806. The control unit 806 could receive an input voltage (such as 5V) and selectively provide power to the charge balancers 804a-804n. In this way, the control unit 806 can control which power supplies 802a-802n are charged by the charge balancers 804a-804n. The control unit 806 could use any suitable information to control the charge balancers 804a-804n, such as the temperature and output voltage of each individual power supply. The control unit 806 includes any suitable structure for controlling the delivery of power to one or more charge balancers 804a-804n.

Figure 9:
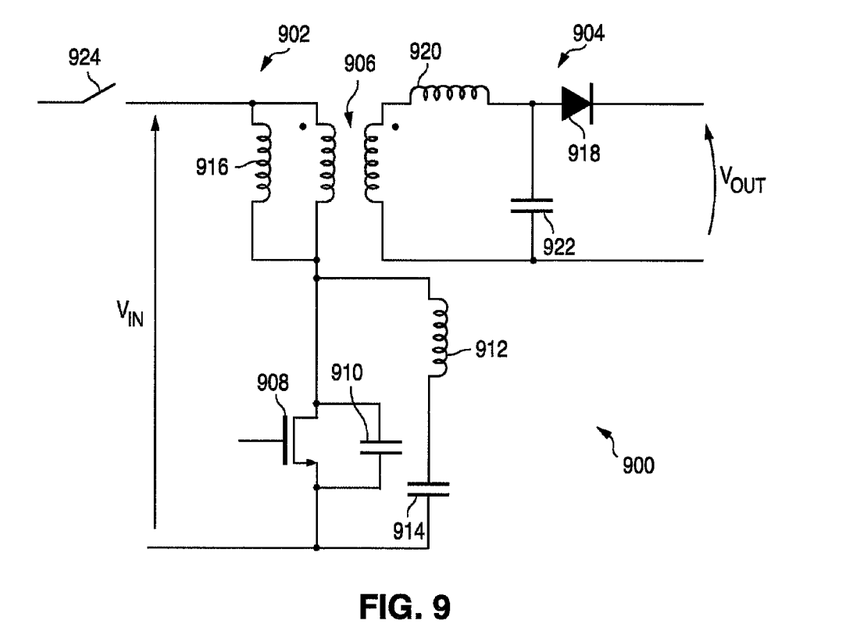

The charge balancers 804a-804n could have any suitable structure for providing power to one or more power supplies. In some embodiments, the charge balancers 804a-804n could be implemented using any of the resonant isolated converters 100-500 shown and described above. In other embodiments, a charge balancer 900 as shown in FIG. 9 could be used. As shown in FIG. 9, the charge balancer 900 includes a primary side 902 and a secondary side 904 isolated by a transformer 906. The primary side 902 includes a switch 908 coupled in parallel with a capacitor 910, which are coupled in parallel with a series-coupled inductor 912 and capacitor 914. The primary side 902 in this example has a resonator that is a "Class φ2" resonator. An inductor 916 is coupled in parallel with the primary side of the transformer 906. The secondary side 904 includes a rectifying diode 918, a resonant inductor 920, and a resonant capacitor 922. Also, a switch 924 can be used to selectively couple the input voltage $V_{IN}$ from the control unit 806 to the charge balancer 900.

Note that in FIG. 9, the charge balancer 900 does not include components to support feedbackless operation. However, the charge balancer 900 could include the various components described above with respect to FIGS. 1 through 5 to support feedbackless operation. For instance, the charge balancer 900 could include the control circuits 116-118 of FIG. 1. The charge balancer 900 could also include the switch 220 of FIG. 2 or the capacitor 322 and switch 324 of FIG. 3. In addition, the charge balancer 900 may or may not include the single-pulse resonant gate driver 600 of FIG. 6 for driving the switch 908. Note that the circuits shown in FIGS. 1 through 5 could also include a "Class φ2" resonator rather than a "Class E" resonator.

The balancing system 800 can support the use of a very high resonant switching frequency, allowing the use of very small components that can be integrated inside a single package. Also, charge storage may be modest, so startup and decay times can be reduced or minimized for improved efficiency. Moreover, any number of power supplies may be charged at the same time and the charging can be individually controlled, which can facilitate faster balancing and/or smaller charge currents. In addition, no high-voltage back-to-back switches or level-shifted drivers may be required, and power supply selection can be made using simple low-voltage NMOS switches (switches 924). While not shown, a buck switcher or other component can be used to provide power to the control unit 806.

Figure 10:
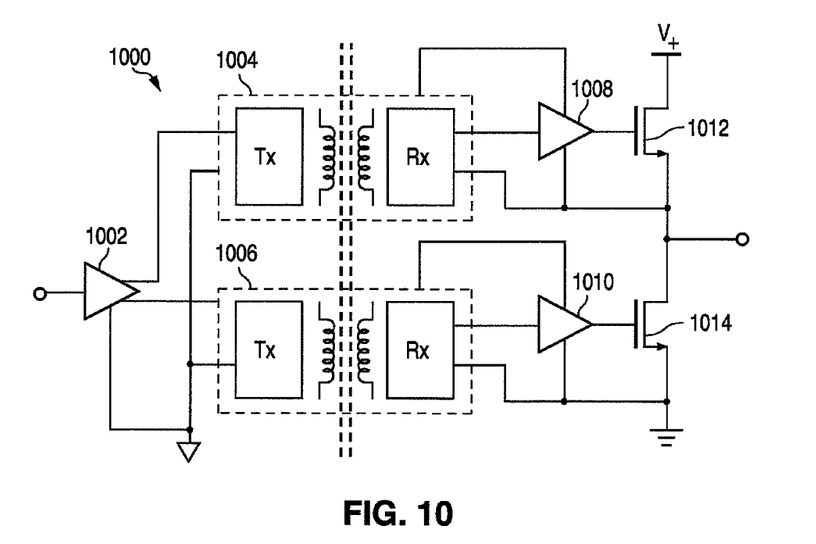

FIG. 10 illustrates an example isolated gate driver 1000, which includes an amplifier 1002 that provides control signals via isolated converters 1004-1006 to gate drivers 1008-1010. The gate drivers 1008-1010 drive switches 1012-1014, respectively, which could represent power transistors. The isolated converters 1004-1006 could represent any of the resonant converters described above. Also, the gate drivers 1008-1010 could represent the single-pulse resonant gate driver 600 described above.

In this example, driver power and commands can be sent through isolated channels, and a floating power ground can be supported. Also, this design supports complete isolation of a power stage. Some specific applications of this design can include high voltage/high power applications, such as AC and DC servo drivers, AC and DC motor controllers, uninterrupted power supplies, electric vehicles, alternative energy power supplies, medical power supplies, welding, induction heating, and aircraft. In particular embodiments, the isolated gate driver 1000 could be used as a 1 W, 5/12V-12V gate driver for high voltage/high power applications.

Figure 11:
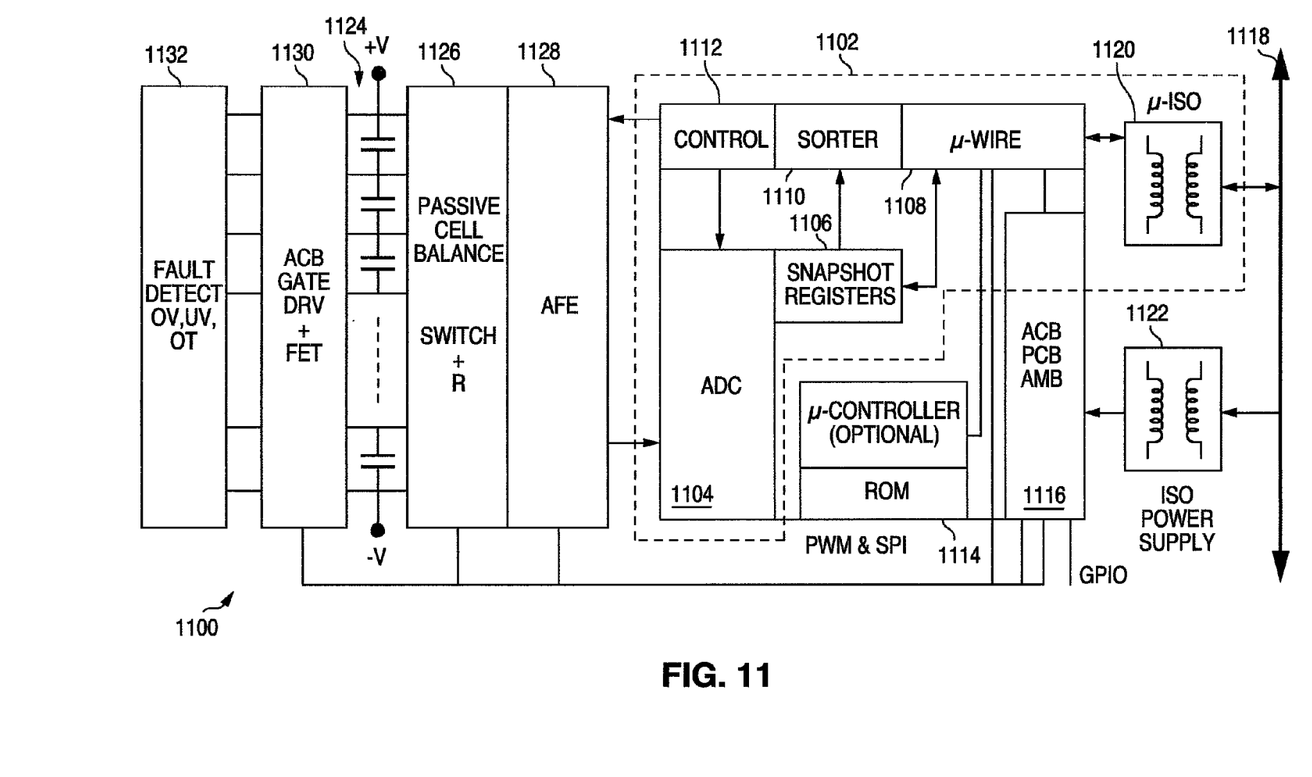

FIG. 11 illustrates an example system 1100 having an isolated sensor 1102. As shown in FIG. 11, the sensor 1102 includes an analog-to-digital converter (ADC) 1104 for converting incoming analog values into digital values. The digital values are stored in one or more registers 1108 and can be sent over an external bus 1118 via a bus interface 1108 (a μ-wire interface in this example). Data can also be received over the bus 1118 via the bus interface 1108, provided to a sorter 1110, and used by a control unit 1112. An optional microcontroller and associated memory 1114 could control the overall operation of the isolated sensor 1102. The sensor 1102 also includes a circuit breaker 1116, such as an air circuit breaker (ACE), power circuit breaker (PCB), or air magnetic circuit breaker (AMB). In this example, two isolated converters 1120-1122 isolate the sensor 1102 from the bus 1118. The isolated converters 1120-1122 could represent any of the isolated converters described above. The converter 1120 could be used to transfer data between the sensor 1102 and the bus 1118, while the converter 1122 could be used to transfer power from the bus 1118 to the sensor 1102.

The sensor 1102 here is used in conjunction with a balancing system associated with a string 1124 of power supplies, such as a string of batteries or battery cells. For example, the sensor 1102 could be used in conjunction with a passive cell balancing circuit 1126, which can use switches and resistors to help balance charges of the power supplies in the string 1126. In this case, an analog front end (AFE) 1128 could be coupled between the sensor 1102 and the passive cell balancing circuit 1126. The sensor 1102 could also be used in conjunction with an active cell balancing (ACB) circuit 1130, which can use gate drivers to drive field effect transistors (FETs). A fault detection unit 1132 can also be used to detect over-voltage (OV), under-voltage (UV), and over-temperature (OT) conditions. Note that the gate drivers in the ACB circuit 1130 could represent the single-pulse resonant gate driver 600 described above. In particular embodiments, the isolated converter 1122 could comprise a 100 mW 5V-5V converter, and the sensor 1102 could become a remote sensor.

Although FIGS. 8 through 11 illustrate examples of systems incorporating a resonant isolated converter and/or a single-pulse resonant gate driver, various changes may be made to FIGS. 8 through 11. For example, each component in these figures could be replaced by any other suitable structure(s) for performing the desired operation(s). Also, these figures represent examples of how a resonant isolated converter and/or a single-pulse resonant gate driver could be used. These components could be used in any other suitable device or system. As a particular example, a resonant isolated converter and/or a single-pulse resonant gate driver could be used in a SIMPLE SWITCHER power module from NATIONAL SEMICONDUCTOR CORP., such as an 8 W 12V-12V switcher.

Example Methods

Figure 12:
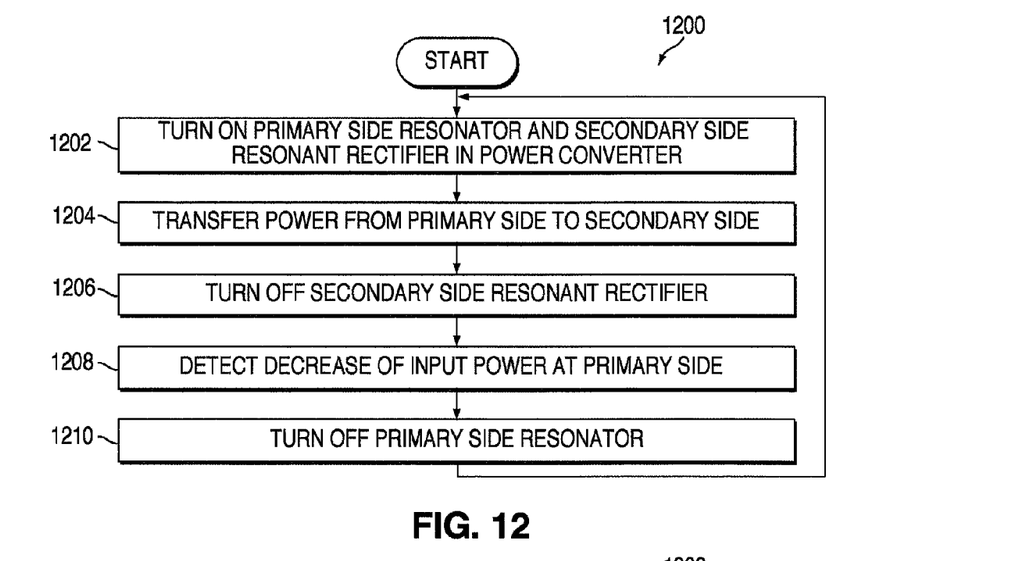
FIG. 12 illustrates an example method for resonant isolated power conversion according to this disclosure.

FIG. 12 illustrates an example method 1200 for resonant isolated power conversion according to this disclosure. As shown in FIG. 12, a primary side resonator and a secondary side resonant rectifier in a power converter are turned on at step 1202. This could include, for example, configuring switches or other components in the power converter to tune the primary side's resonator with the secondary side's resonant rectifier. Power is then transferred from the primary side to the secondary side of the power converter at step 1204. This could include, for example, the primary side's resonator oscillating and transferring power to the secondary side's resonant rectifier, which is inductively coupled to the resonator.

At some point, the secondary side resonant rectifier is turned off at step 1206. This could include, for example, opening a switch coupled in series with the secondary side's resonant rectifier or altering a capacitance of the secondary side's resonant rectifier to detune the resonant rectifier. This reduces or stops the transfer of power from the primary side to the secondary side. The primary side therefore detects a decrease in the input power used by the primary side resonator at step 1208, and the primary side resonator is turned off at step 1210. This could include, for example, a gate driver turning off the primary side's resonator upon detecting the drop in input power, thereby helping to reduce losses in the primary side.

At that point, the primary and secondary sides could remain off for a specified period of time. The method 1200 returns to step 1202, where another cycle of power transfer can occur. Note that all of this occurs without using a feedback line from the secondary side to the primary side of the power converter.

Although FIG. 12 illustrates one example of a method 1200 for resonant isolated power conversion, various changes may be made to FIG. 12. For example, while shown as a series of steps, various steps in FIG. 12 could overlap, occur in parallel, or occur any number of times. Also, as noted above, the primary side's resonator could remain active even when the secondary side's resonant rectifier is inactive.

Figure 13:
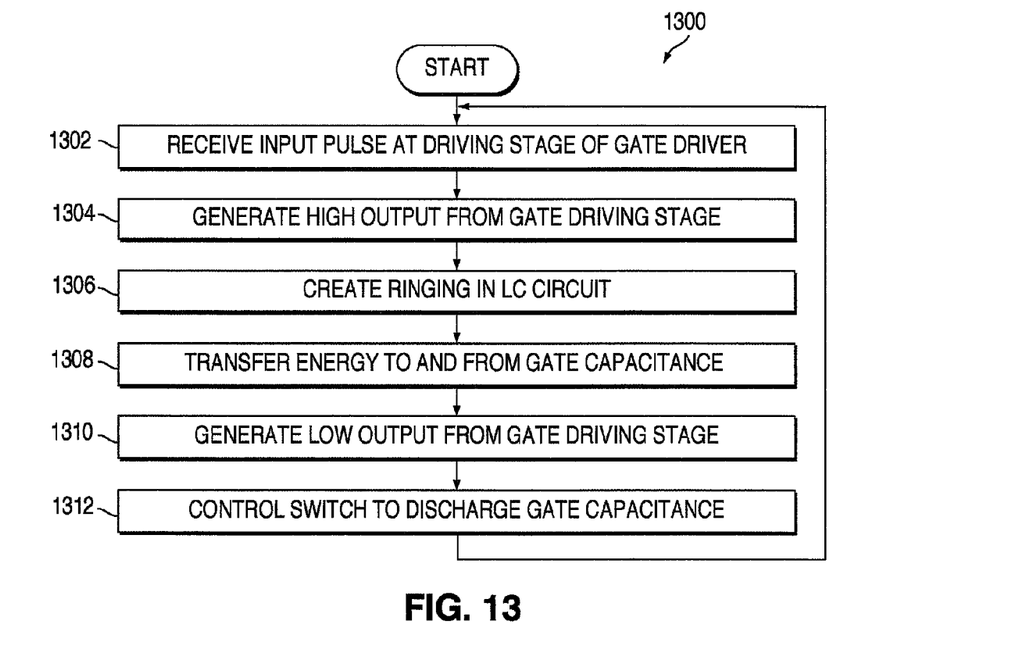
FIG. 13 illustrates an example method for single-pulse resonant gave driving according to this disclosure.

FIG. 13 illustrates an example method 1300 for single-pulse resonant gave driving according to this disclosure. As shown in FIG. 13, an input pulse is received at the driving stage of a gate driver at step 1302. This could include, for example, a control circuit providing a pulse to the driving stage of the gate driver 600.

A high output is generated from the driving stage of the gate driver at step 1304. This could include, for example, turning the switch 608 on and turning the switch 610 off. The high output of the driving stage creates ringing in an LC circuit at step 1306. The LC circuit is formed using at least an inductor and a gate capacitance of the gate being driven by the gate driver. Energy is therefore transferred to and from the gate capacitance of the gate being driven at step 1308.

A low output is generated from the driving stage of the gate driver at step 1310, and a switch is controlled to discharge any remaining charge on the gate capacitance at step 1312. This could include, for example, turning the switch 608 off and turning the switch 610 on. This could also include closing the switch 616 to couple the gate capacitance to ground.

The result of this process is that energy is transferred to and from the gate capacitance in order to turn a switch on and off. However, much less power is dissipated during this process as a result of the ringing created in the LC circuit. This process could be repeated at any suitable interval, and the interval can change over time. This allows the switch gate to be driven at any suitable duty cycle, which can enable more effective control over the switch and regulation of an output voltage being generated using the switch.

Although FIG. 13 illustrates one example of a method 1300 for single-pulse resonant gave driving, various changes may be made to FIG. 13. For example, while shown as a series of steps, various steps in FIG. 13 could overlap, occur in parallel, or occur any number of times.

It may be advantageous to set forth definitions of certain words and phrases that have been used within this patent document. The term "couple" and its derivatives refer to any direct or indirect communication between two or more components, whether or not those components are in physical contact with one another. The terms "include" and "comprise," as well as derivatives thereof, mean inclusion without limitation. The term "or" is inclusive, meaning and/or. The phrase "associated with", as well as derivatives thereof, may mean to include, be included within, interconnect with, contain, be contained within, connect to or with, couple to or with, be communicable with, cooperate with, interleave, juxtapose, be proximate to, be bound to or with, have, have a property of, have a relationship to or with, or the like.

While this disclosure has described certain embodiments and generally associated methods, alterations and permutations of these embodiments and methods will be apparent to those skilled in the art. Accordingly, the above description of example embodiments does not define or constrain this invention. Other changes, substitutions, and alterations are also possible without departing from the spirit and scope of this invention as defined by the following claims.

What is claimed is:

1. A resonant gate driver comprising:
a first switch, having a gate with resistance and capacitance and also a source, wherein the source of the first switch is coupled to ground;
a resonance mechanism configured to recover energy used to charge and discharge the first switch's capacitance, while allowing control of the duty cycle of the switch's operation;
second and third switches, each having a source, a drain and a gate, coupled in series, wherein the gates of the second and third switches are coupled together to receive the same input signal and the drains of the second and third switches are coupled together;
wherein the second switch is a PMOS transistor and the third switch is an NMOS transistor, wherein the second and third switches are configured to form a driving stage for driving the gate of the first switch;
wherein the source of the second switch is coupled to the positive supply $V_D$ and the source of the third switch is coupled to ground;
an inductor, having first and second terminals, wherein the first terminal is coupled to the drains of the second and third transistors;
a capacitor having first and second terminals, wherein the first terminal is coupled to the second terminal of the inductor and the second terminal of the capacitor is coupled to the gate of the first switch;
a fourth switch, having a source, a drain and a gate, wherein the gate of the fourth switch is coupled to the gate of the third switch, the source of the fourth switch is coupled to ground and the drain of the fourth switch is coupled to the gate of the first switch, wherein the fourth switch is an NMOS transistor;
wherein the inductor and the gate capacitance of the first switch form an LC circuit that is configured to respond to a single pulse with a ringing at its natural resonance frequency; and
a control circuit configured to regulate the duty cycle of the input signal by adjusting the off-time between consecutive pulses.

2. The resonant gate driver of claim 1, wherein the fourth switch is configured to selectively couple the gate of the first switch to ground in order to discharge the gate capacitance of the first switch.

3. The resonant gate driver of claim 2, wherein:
an amount of energy dissipated from the gate capacitance of the first switch is approximately equal to $$E_D^1 = C_G V_L^2;$$

$E_D^1$ denotes the dissipated energy;
$C_G$ denotes the gate capacitance; and
$V_L$ denotes a low peak voltage on the gate of the transistor switch.

4. The resonant gate driver of claim 1, wherein the capacitor is configured to adjust a high peak voltage on the gate of the first switch.

5. A method comprising:
receiving an input signal at a driving stage of a gate driver;
generating a gate drive signal for a gate of a first switch using the driving stage;
providing the gate drive signal to an LC circuit comprising an inductor and a gate capacitance of the first switch; and
generating a ringing in the LC circuit at a resonance frequency of the LC circuit based on a single pulse in the gate drive signal so as to transfer energy into and out of the gate capacitance of the first switch.

6. The method of claim 5, further comprising:
selectively coupling the gate of the first switch to ground in order to discharge the gate capacitance.

7. The method of claim 6, wherein:
an amount of energy dissipated from the gate capacitance of the first switch is approximately equal to $$E_D^1 = C_G V_L^2;$$

$E_D^1$ denotes the dissipated energy;
$C_G$ denotes the gate capacitance; and
$V_L$ denotes a low peak voltage on the gate of the first switch.

8. The method of claim 5, wherein the LC circuit comprises the inductor, the gate capacitance of the first switch, and a capacitor coupled in series with the inductor and the gate capacitance.

9. The method of claim 8, further comprising:
adjusting a high peak voltage on the gate of the first switch using the capacitor.

10. The method of claim 5, further comprising:
regulating a duty cycle of the gate drive signal.

11. The method of claim 10, wherein regulating the duty cycle of the gate drive signal comprises adjusting an off-time between consecutive pulses in the input signal.

12. A system comprising:
a first switch; and
a gate driving circuit comprising:
a driving stage configured to receive an input signal and generate a gate drive signal for a gate of the first switch; and
an LC circuit comprising an inductor and a gate capacitance of the first switch, wherein the LC circuit is configured so that a single pulse in the gate drive signal generates a ringing in the LC circuit at a resonance frequency of the LC circuit to transfer energy into and out of the gate capacitance of the first switch.

13. The system of claim 12, further comprising:
a fourth switch configured to selectively couple the gate of the first switch to ground in order to discharge the gate capacitance of the first switch.

14. The system of claim 13, wherein:
an amount of energy dissipated from the gate capacitance of the first switch is approximately equal to $$E_D^1 = C_G V_L^2;$$

$E_D^1$ denotes the dissipated energy;
$C_G$ denotes the gate capacitance; and
$V_L$ denotes a low peak voltage on the gate of the first switch.

15. The system of claim 12, wherein the gate driving circuit further comprises:
a capacitor coupled in series with the inductor and the gate capacitance;
wherein the LC circuit comprises the inductor, the gate capacitance of the first switch, and the capacitor; and
wherein the capacitor is configured to adjust a high peak voltage on the gate of the first switch.

16. The system of claim 12, wherein the gate driving circuit further comprises:
a control circuit configured to provide the input signal to the driving stage, the control circuit configured to regulate a duty cycle of the gate drive signal by adjusting an off-time between consecutive pulses in the input signal.

17. The system of claim 12, wherein the first switch comprises one of: a transistor switch in a resonant isolated power converter, a transistor switch in an active balancing circuit for a power supply, and a power transistor.

* * * * *